(12) United States Patent
Namiki et al.

(10) Patent No.: US 8,013,624 B2
(45) Date of Patent: Sep. 6, 2011

(54) ELECTRONIC DEVICE TEST APPARATUS AND METHOD OF MOUNTING OF PERFORMANCE BOARD IN ELECTRONIC DEVICE TEST APPARATUS

(75) Inventors: Katsuhiko Namiki, Tokyo (JP); Shigeaki Naito, Tokyo (JP)

(73) Assignee: Advantest Corporation, Tokyo (JP)

( * ) Notice: Subject to any disclaimer, the term of this patent is extended or adjusted under 35 U.S.C. 154(b) by 248 days.

(21) Appl. No.: 12/091,962

(22) PCT Filed: Mar. 10, 2006

(86) PCT No.: PCT/JP2006/304755
§ 371 (c)(1),
(2), (4) Date: Aug. 12, 2008

(87) PCT Pub. No.: WO2007/057990
PCT Pub. Date: May 24, 2007

(65) Prior Publication Data
US 2009/0237100 A1   Sep. 24, 2009

(30) Foreign Application Priority Data

Nov. 15, 2005   (WO) .................. PCT/JP2005/020971

(51) Int. Cl.
*G01R 31/26* (2006.01)
(52) U.S. Cl. ................................. 324/762.01
(58) Field of Classification Search .................. 324/754, 324/761–762, 755–758, 765, 158.1, 760, 324/762.01–762.1, 763.01–763.02, 757.01–757.05, 324/754.01–754.09; 257/48; 438/14–18
See application file for complete search history.

(56) References Cited

U.S. PATENT DOCUMENTS

| | | | |
|---|---|---|---|
| 5,825,192 A | 10/1998 | Hagihara | |
| 5,923,180 A | 7/1999 | Botka et al. | |
| 6,305,230 B1 | 10/2001 | Kasukabe et al. | |
| 6,600,334 B1 * | 7/2003 | Hembree et al. | 324/765 |
| 6,798,224 B1 * | 9/2004 | Hembree et al. | 324/754 |
| 7,129,723 B2 | 10/2006 | Bohm | |
| 2005/0264315 A1 | 12/2005 | Bohm | |
| 2007/0200555 A1 | 8/2007 | Mizushima et al. | |
| 2007/0206967 A1 | 9/2007 | Kikuchi et al. | |

(Continued)

FOREIGN PATENT DOCUMENTS

DE            197522229           8/1998

(Continued)

OTHER PUBLICATIONS

English language Abstract of JP 9-153528.

(Continued)

*Primary Examiner* — Huy Phan
*Assistant Examiner* — Tung X. Nguyen
(74) *Attorney, Agent, or Firm* — Greenblum & Bernstein, P.L.C.

(57) ABSTRACT

An electronic device test apparatus comprising: a test apparatus body for testing IC devices formed on a wafer for electrical characteristics; a probe card for electrically connecting the IC devices and the test apparatus body; a prober for pushing the wafer against the probe card so as to electrically connect the IC devices and the probe card; an abutting mechanism extending toward the back surface of the probe card and abutting against the back surface of the probe card; and a lock mechanism fixing the extension of the abutting mechanism in the state with the abutting mechanism abutting against the back surface of the probe card.

7 Claims, 20 Drawing Sheets

U.S. PATENT DOCUMENTS

| | | |
|---|---|---|
| 2007/0222455 A1 | 9/2007 | Haruta et al. |
| 2008/0038098 A1 | 2/2008 | Ito et al. |
| 2008/0042667 A1 | 2/2008 | Yamashita et al. |

FOREIGN PATENT DOCUMENTS

| | | |
|---|---|---|
| DE | 102004027887 | 12/2005 |
| JP | 9-36188 | 2/1997 |
| JP | 9-153528 | 6/1997 |
| JP | 11-23615 | 1/1999 |
| JP | 2004-128202 | 4/2004 |
| JP | 2005-251813 | 9/2005 |
| KR | 0282737 | 3/2001 |

OTHER PUBLICATIONS

English language Abstract of JP 2005-251813.
English language Abstract of JP 11-23615.
English language Abstract of JP 9-36188.
English language Abstract of JP 2004-128202.

\* cited by examiner

ELECTRONIC DEVICE TEST APPARATUS AND METHOD OF MOUNTING OF PERFORMANCE BOARD IN ELECTRONIC DEVICE TEST APPARATUS

TECHNICAL FIELD

The present invention relates to an electronic device test apparatus for pushing semiconductor integrated circuit devices formed on a wafer and other various electronic devices (hereinafter also referred to representatively as "IC devices") against a performance board and using a test apparatus body electrically connected to the performance board to test the electronic devices under test for their electrical characteristics and to a method of mounting of a performance board in an electronic device test apparatus.

BACKGROUND ART

In the process of production of IC devices and other electronic devices, an electronic device test apparatus is used to test the IC devices for performance and functions in the state formed on the wafer or in the packaged state.

As an apparatus 1' for testing IC devices formed on a wafer W for their electrical characteristics, as shown in FIG. 15, there has been known in the past an apparatus using a prober 70 to push the wafer W against a probe card 50 to bring the probe needles 51 of the probe card 50 into electrical contact with the electrodes of the IC devices and testing the IC devices for electrical characteristics via the probe card 50 and a test head 10 by a tester (not shown). A large number of connectors 53 for electrical connection are arranged at the outer periphery of the probe card 50, while a large number of probe needles 51 are arranged at the center part of the probe card 50.

In this apparatus 1', as shown by the broken line arrows X in the figure, the pushing force of the prober 70 pushing the wafer W against the probe card 50 is transmitted through a circular end face holder 60 and an adapter 65 to a housing 71 of the prober 70, so sometimes this pushing force causes the center part of the probe card 50 where the probe needles 51 are provided to bend and deform. In particular, along with the increase in the number of simultaneous measurements in recent years, a further larger number of probe needles 51 have to be mounted on the probe card 50. As a result, the required pushing force is further increased. Further, bending and deformation of the probe card 50 lead to differences in the contact pressure among the probe needles 51, so stable electrical contact is obstructed and contact failure sometimes occurs. These destabilizing factors lead to deterioration of the test quality.

As opposed to this, a stiffener 54 reinforcing the probe card 50 can be increased in rigidity so as to prevent deformation of the probe card 50, but the change in material and shape lead to an increase in costs and the increase in weight obstructs handling of the probe card at the time of change of the type of devices tested. Further, the temperature conditions under which the tests are conducted fluctuate from a high temperature to a low temperature, so measures have to be taken against the heat expansion of a printed circuit board 52 or a stiffener 54 of the probe card 50. Further, the probe card 50 changed in accordance with the type of the wafer W under test will sometimes differ in board thickness, so a large number of types of stiffeners 54 would have to be prepared to fit with many kinds of the probe card 50.

DISCLOSURE OF THE INVENTION

The present invention has as its object to provide an electronic device test apparatus being able to prevent deformation of a performance board and a method of mounting a performance board in an electronic device test apparatus.

(1) To achieve the above object, according to a first aspect of the present invention, there is provided an electronic device test apparatus comprising: a test apparatus body for testing an electronic device under test for electrical characteristics; a performance board so as to electrically connect the electronic device under test and the test apparatus body; and a pushing means for pushing the electronic device under test against the performance board so as to electrically connect the electronic device under test and the performance board, wherein the electronic device test apparatus further comprising: an abutting means extending toward a back surface of the performance board and abutting against the back surface of the performance board; and a fixing means for fixing an amount of extension of the abutting means in a state where the abutting means abuts against the back surface of the performance board (see claim 1).

In the present invention, the abutting means abuts against the back surface of the performance board and the fixing means fixes the amount of extension of the abutting means. Due to this, at the time of testing, the pushing force applied by the pushing means can be directly received by the performance board at the back surface, so deformation of the performance board can be prevented.

Further, in the present invention, the abutting means extends toward the back surface of the performance board before the abutting means abuts against the back surface of the performance board, so differences in thickness of the performance board changed for each type of wafer W under test, or variations in the thickness direction due to processing error etc. can be automatically adjusted by the stroke of the abutting means and stable contact between the electronic device under test and the performance board can be secured.

While not particularly limited to this in the above invention, the abutting means is preferably provided at the test apparatus body (see claim 2).

While not particularly limited to this in the above invention, the abutting means preferably abuts against a center part of the performance board and/or a periphery of the center part (see claim 3).

While not particularly limited to this in the above invention, the apparatus preferably further comprises a holding means for holding the performance board at a center part of the performance board and/or a periphery of the center part (see claim 4).

While not particularly limited to this in the above invention, the holding means preferably pulls the performance board toward the abutting means so that the abutting means closely contacts the back surface of the performance board (see claim 5).

While not particularly limited to this in the above invention, the holding means preferably is provided at the test apparatus body (see claim 6).

While not particularly limited to this in the above invention, the electronic device under test is a semiconductor device formed on a wafer, the performance board is a probe card having probe needles electrically contacting with electrodes of the semiconductor device, the pushing means is a prober able to hold and move the wafer, and the abutting means abuts against a back surface of a part of the probe card where the probe needles are provided and/or of a periphery of the part where the probe needles are provided (see claim 7).

(2) To achieve the above object, according to a second aspect of the present invention, there is provided a method of mounting a performance board in an electronic device test apparatus comprising: a test apparatus body for testing an electronic device under test for electrical characteristics; a performance board so as to electrically connect the electronic device under test and the test apparatus body; and a pushing means for pushing the electronic device under test against the performance board so as to electrically connect the electronic device under test to the performance board, the method of mounting a performance board comprising: a connection step of electrically connecting the performance board and the test apparatus body through connectors; an abutting step of extending an abutting means provided at the test apparatus body toward a back surface of the performance board and making the abutting means abut against the back surface of the performance board; and a fixing step of fixing an amount of extension of the abutting means in a state where the abutting means abuts against the back surface of the performance board (see claim 8).

In the present invention, the performance board is held by a holding member, connectors are connected, then in the abutting step the abutting means is extended to abut against the back surface of the performance board and in the fixing step the amount of extension of the abutting means is fixed. Due to this, the pushing force applied by the pushing means at the time of a test can be directly received at the back surface of the performance board, so deformation of the performance board can be prevented.

Further, before making the abutting means abut against the back surface of the performance board in the abutting step, the abutting means is made to extend toward the performance board, so any variation in the thickness direction of the performance board due to manufacturing tolerances etc. can be absorbed by the stroke of the abutting means and stable contact between the electronic device under test and the performance board can be secured.

While not particularly limited to this in the above invention, it is preferable, in the abutting step, making the abutting means abut against a center part of the performance board and/or a periphery of the center part (see claim 9).

While not particularly limited to this in the above invention, preferably the method further comprises a holding step of holding the performance board at a center part of the performance board and/or a periphery of the center part (see claim 10).

While not particularly limited to this in the above invention, it is preferable, in the holding step, pulling the performance board toward the abutting means so that the abutting means closely contacts the back surface of the performance board (see claim 11).

While not particularly limited to this in the above invention, preferably the electronic device under test is a semiconductor device formed on a wafer, the performance board is a probe card having probe needles electrically contacting electrodes of the semiconductor device, the pushing means is a prober able to hold and move the wafer, and in the abutting step, the abutting means is made to abut against a back surface of a part of the probe card where the probe needles are provided and/or of a periphery of the part where the probe needles are provided (see claim 12).

(3) To achieve the above object, according to the present invention, there is provided a probe card holding apparatus for holding a probe card in a test head using a probe card to test a semiconductor device formed on a wafer for electrical characteristics, comprising: a clamp head formed at a center part of a back surface of the probe card; and a holding means provided at the test head and engaging with the clamp head to hold the probe card (see claim 13).

While not particularly limited to this in the above invention, preferably the apparatus comprises an abutting means extending toward the probe card and abutting against the back surface of the probe card; and a fixing means for fixing an amount of extension of the abutting means in a state where the abutting means abuts against the back surface of the probe card (see claim 14).

While not particularly limited to this in the above invention, preferably the apparatus comprises a moving means for moving the holding means holding the probe card with respect to the abutting means so as to pull the probe card toward the abutting means (see claim 15).

DESCRIPTION OF NOTATIONS

Figure 1:
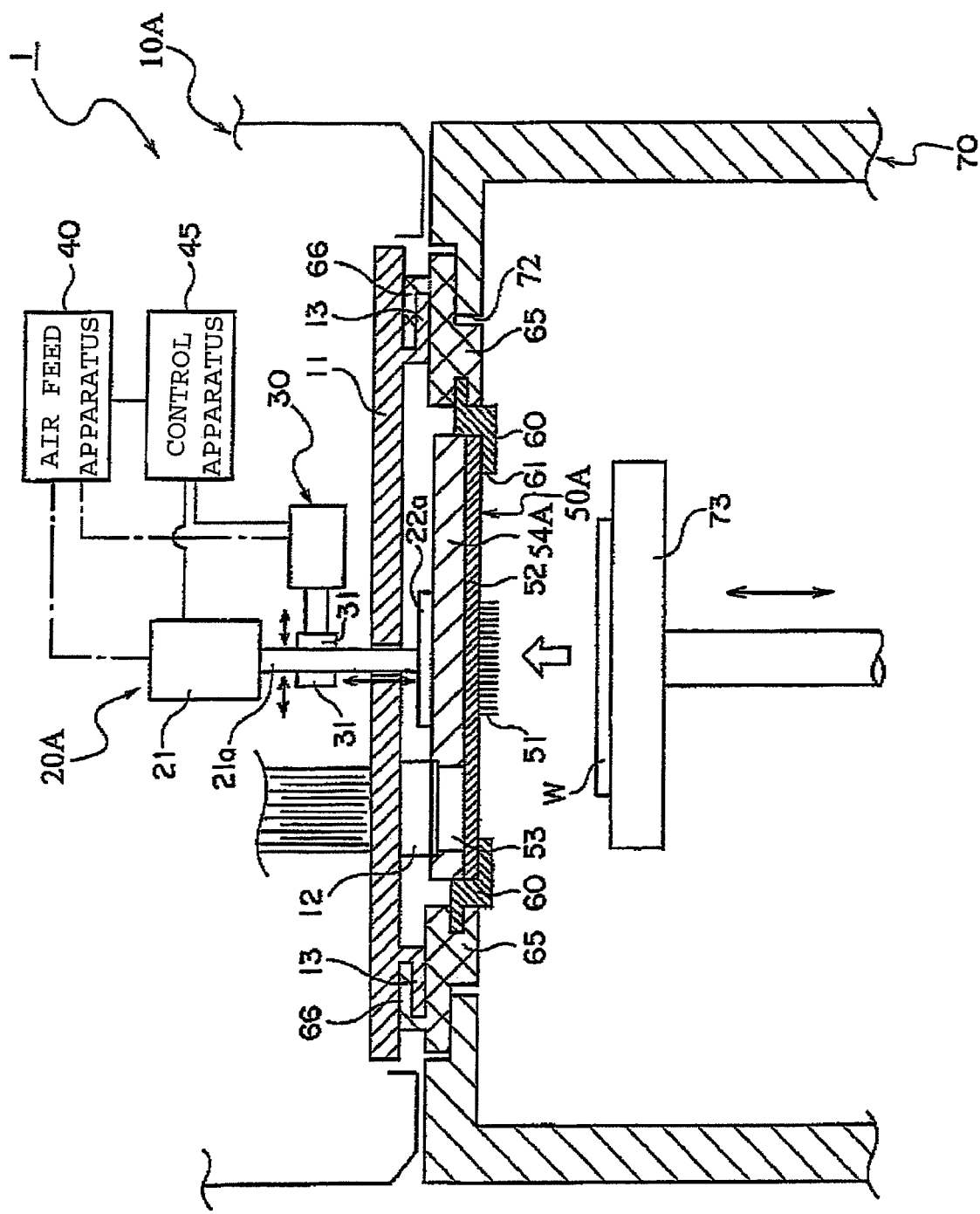
FIG. 1 is a schematic cross-sectional view showing the configuration of an electronic device test apparatus according to the first embodiment of the present invention.

1 . . . electronic device test apparatus
10A, 10B . . . test head
11 . . . HiFix interface
20A, 20B . . . abutting mechanism
21 . . . air cylinder
21a . . . rod
22a to 22d . . . abutting member
30 . . . lock mechanism
31 . . . clamp
40 . . . air feed apparatus
45 . . . control apparatus
80 . . . slide body
84 . . . steel ball
90 . . . air cylinder
50A, 50B . . . probe card
51 . . . probe needle
52 . . . printed circuit board
54A, 54B . . . stiffener
57 . . . clamp head
60 . . . holder
65 . . . adapter
70 . . . prober
W . . . wafer

BEST MODE FOR WORKING THE INVENTION

Below, embodiments of the present invention will be explained based on the drawings.

First Embodiment

Figure 2:
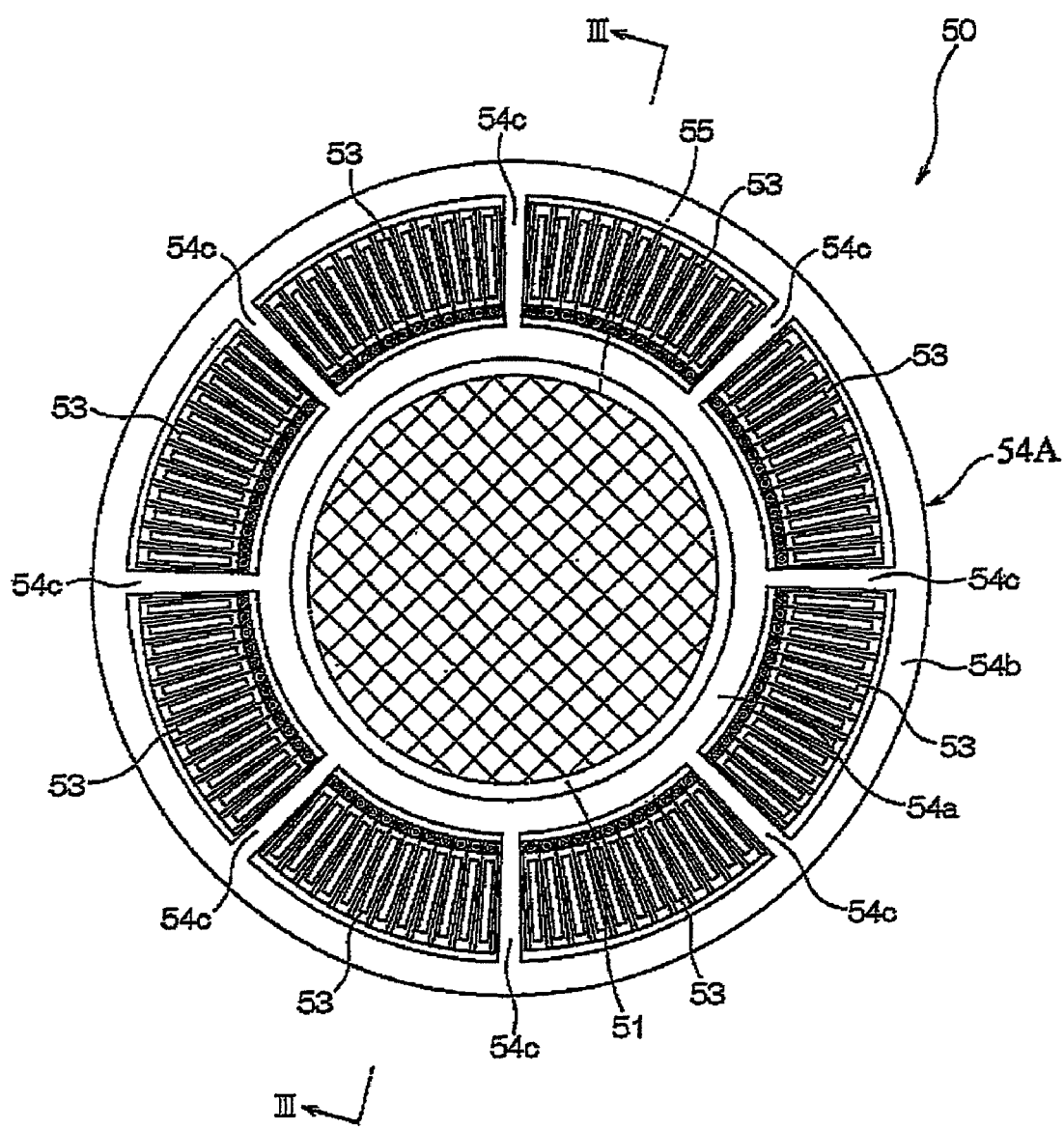
FIG. 2 is a plan view of a probe card in the first embodiment of the present invention as seen from the back surface side.
Figure 3:
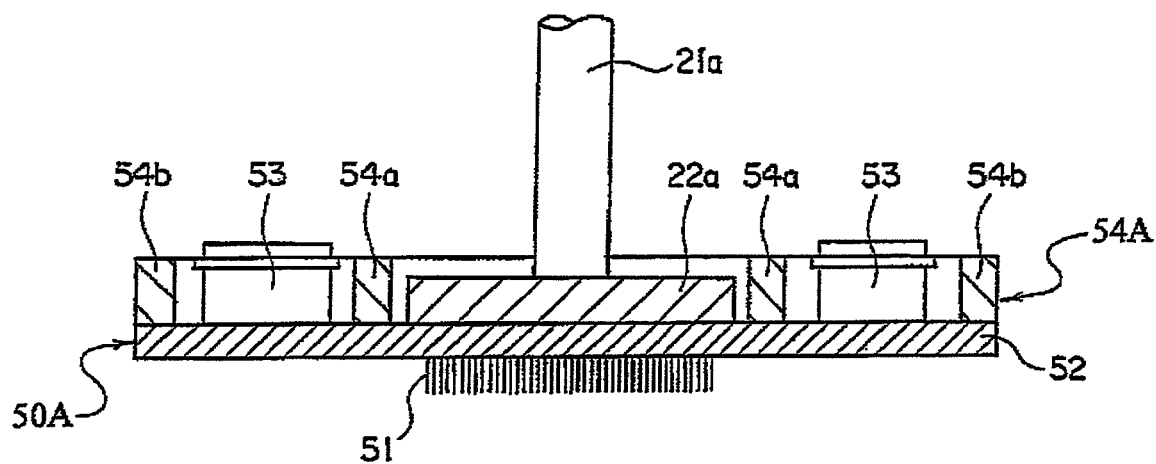
FIG. 3 is a schematic cross-sectional view along the line III-III of FIG. 2.

FIG. 1 is a schematic cross-sectional view showing a configuration of an electronic device test apparatus according to the first embodiment of the present invention, FIG. 2 is a plan view of a probe card in the first embodiment of the present invention as seen from the back surface side, and FIG. 3 is a schematic cross-sectional view along the line III-III of FIG. 2.

The electronic device test apparatus 1 according to the present embodiment is an apparatus for testing IC devices formed on a wafer W for electrical characteristics. This electronic device test apparatus 1, as shown in FIG. 1, comprises a test head 10A electrically connected to a tester (not shown) for conducting the test of the IC devices through a cable (not shown), a probe card 50A for electrically connecting the IC devices on the wafer W and the test head 10A, and a prober 70 for pushing the wafer W against the probe card 50A.

The probe card 50A, as shown in FIG. 1 to FIG. 3, is electrically connected to the test head 10A through a HiFix interface 11 electrically and mechanically connecting them. Further, this probe card 50A comprises a large number of probe needles 51 electrically connecting to electrodes of the IC devices formed on the wafer W, a printed circuit board 52 on which these probe needles 51 are mounted, a large number of connectors 53 for electrically connecting the probe card 50A to the connectors 12 at the HiFix interface 11 side of the test head 10A, and a stiffener 54A for reinforcing the probe card 50A. Note that the probe card 50A in the present embodiment corresponds to an example of the performance board in the claims.

As shown in the drawings, the probe needles 51 are provided at the substantial center part of one main surface of the printed circuit board 52. As opposed to this, the connectors 53 and stiffener 54A are provided at the other main surface of the printed circuit board 52.

The connectors 53, as shown in FIG. 2, are arranged radially so as to surround the substantial center part of the printed circuit board 52. The stiffener 54A comprises two concentric ring-shaped members 54a, 54b and struts 54c connecting the same and surrounds the groups of the connectors 53. Due to this, openings are formed connecting to the connectors 12 at the HiFix interface 11 side of the other connecting side. Note that in the present embodiment, in the probe card 50A, the surface at the side where the probe needles 51 are mounted is called the "front surface" while the surface at the side where the connectors 53 and stiffener 54A are provided is called the "back surface".

This probe card 50A is supported by a ring-shaped holder 60 so that the probe needles 51 face downward through the center opening 61. The holder 60 is supported by a ring-shaped adapter 65 in the state supporting the probe card 50A. Further, the adapter 65 is supported at an opening 72 formed in the housing 71 of the prober 70. This adapter 65 adapts probe cards 50A, which differ in size depending on the type of the wafer W under test and the shape of the test head 10A, to the opening 72 of the prober 70. The probe card 50A side and the HiFix interface 11 side, as shown in FIG. 1, are mechanically connected by engagement of hooks 13 provided at the bottom of the HiFix interface 11 and hooks 66 provided at the adapter 65.

The HiFix interface 11 is mounted at the bottom of the test head 10. Connectors 12 are provided at the bottom surface of this HiFix interface 11. One end of each connector 12, as shown in FIG. 1, is usually connected to a coaxial cable. Further, the connectors 12 at the test head 10A side and the connectors 53 provided at the back surface of the probe card 50A are coupled so that the test head 10A and the probe card 50A are electrically connected. As the connectors 12, 53, for example ZIF (Zero Insertion Force) connectors etc. may be used.

The prober 70 can hold the wafer W by a vacuum chuck and has a transport arm 73 which can move this held wafer W in the XYZ directions and rotate it by θ and can transport the wafer W from the outside to the inside of the housing 71. Further, at the time of testing, the transport arm 73 positions the wafer W to face the probe card 50A passing through the opening 72 and entering the housing 71 and pushes it against the card 50A. In that state, the tester inputs test signals to IC devices formed on the wafer W through the test head 10A to thereby test the IC devices.

The electronic device test apparatus 1 according to the present embodiment, as shown in FIG. 1, further comprises an abutting mechanism 20A extending toward the probe card 50A and abutting against the back surface of that probe card 50A, a lock mechanism 30 fixing the amount of extension of that abutting mechanism 20A in the abutting state, an air feed apparatus 40 feeding drive use air to the abutting mechanism 20A and a lock mechanism 30, and a control apparatus 45 controlling their operations.

The abutting mechanism 20A comprises an air cylinder 21 able to make the rod 21a extend in the vertical direction by air fed from the air feed apparatus 40. The front end of the rod 21a is provided with an abutting member 22a abutting against the back surface of the probe card 50A.

This abutting mechanism 20A, as shown in FIG. 2 and FIG. 3, is mechanically fixed to the HiFix interface 11 of the test head 10A in the state with the abutting member 22a abutting against the substantial center part (abutting part 55 shown in FIG. 2) of the back surface of the printed circuit board 52.

Figure 4:
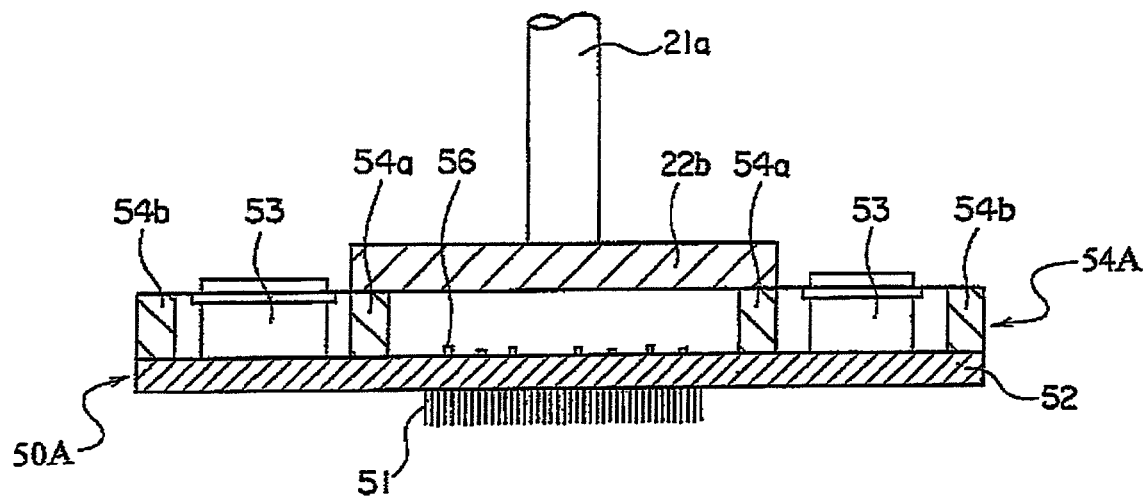
FIG. 4 is a schematic cross-sectional view of an abutting member and the probe card in another embodiment of the present invention.
Figure 5:
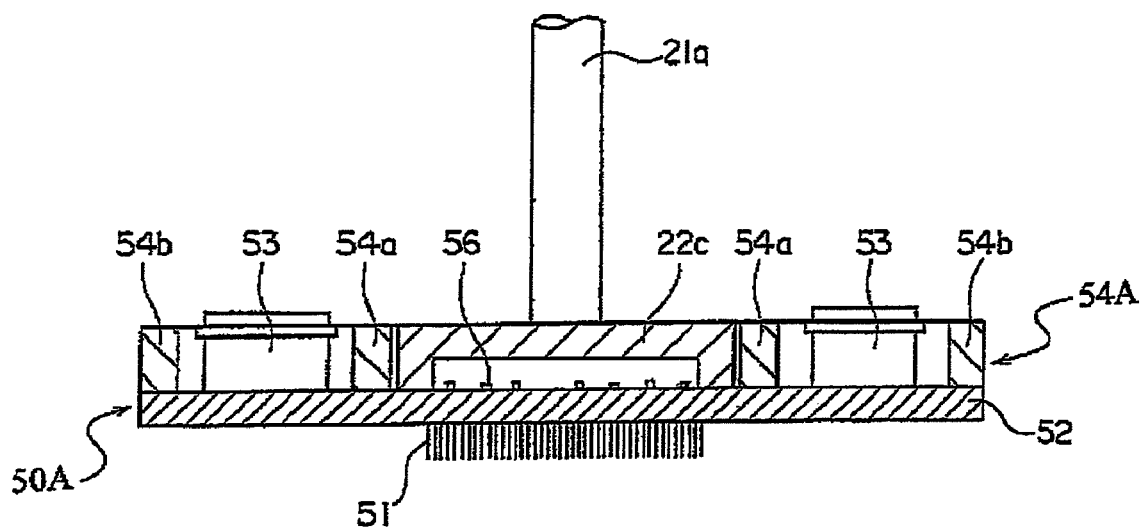
FIG. 5 is a schematic cross-sectional view of an abutting member and a probe card in still another embodiment of the present invention.

FIG. 4 is a schematic cross-sectional view of an abutting member and a probe card in another embodiment of the present invention, and FIG. 5 is a schematic cross-sectional view of an abutting member and a probe card in still another embodiment of the present invention.

When there are electronic devices or other projections 56 at the substantial center part of the back surface of the probe card 50A, as shown in FIG. 4, the abutting member 22b may be configured to abut against the top surface of the inside ring-shaped member 54a of the stiffener 54A. Alternatively, as shown in FIG. 5, an abutting member 22c having a recessed abutting face may be used to abut against the back surface of the printed circuit board 52. This recess enables the projections 56 to be avoided.

Note that a holding mechanism for holding the back surface of the probe card 50A by for example suction may also be provided at the bottom surface of the abutting member 22a. This makes the holder 60 unnecessary, so heat expansion of the probe card 50A can be allowed in the diametrical direction to eliminate deformation in the height direction and stable contact can be secured.

The lock mechanism 30 has an air-type clamp 31 using air fed from the air feed apparatus 40 to clamp the rod 21a and firmly fix the current extended state of the rod 21a so as to prevent the rod 21a of the abutting mechanism 20A from moving when the transport arm 73 pushes against the wafer W.

Note that the lock mechanism 30 need not be an air type clamp 31. It is also possible to for example use a magnet etc. to fix the rod 21a. Further, for example, as an abutting mechanism 20A and a lock mechanism 30, a locking air cylinder etc. may be used so that the abutting mechanism 20A and lock mechanism 30 are formed integrally. As the actuator of the abutting mechanism 20A and lock mechanism 30, an electric motor etc. may also be used.

The control apparatus 45 controls the drive operations of the abutting mechanism 20A and lock mechanism 30 to extend the rod 21a of the abutting mechanism 20A so that the pushing action of the transport arm 73 is directly received by the back surface of the probe card 50A and to fix the movement position of the rod 21a by the lock mechanism 30 at that amount of extension. Specifically, for example, it starts to count the time from the start of feed of air from the air feed apparatus 40 to the air cylinder 21 of the abutting mechanism 20A and, after the elapse of a predetermined time, starts to feed air to the clamp 31 of the lock mechanism 30. Due to this, the amount of extension of the abutting mechanism 20A is fixed by the lock mechanism 30 in the state abutting against the probe card 50A.

Below, a method of mounting a probe card in an electronic device test apparatus according to the first embodiment of the present invention will be explained.

Figure 6:
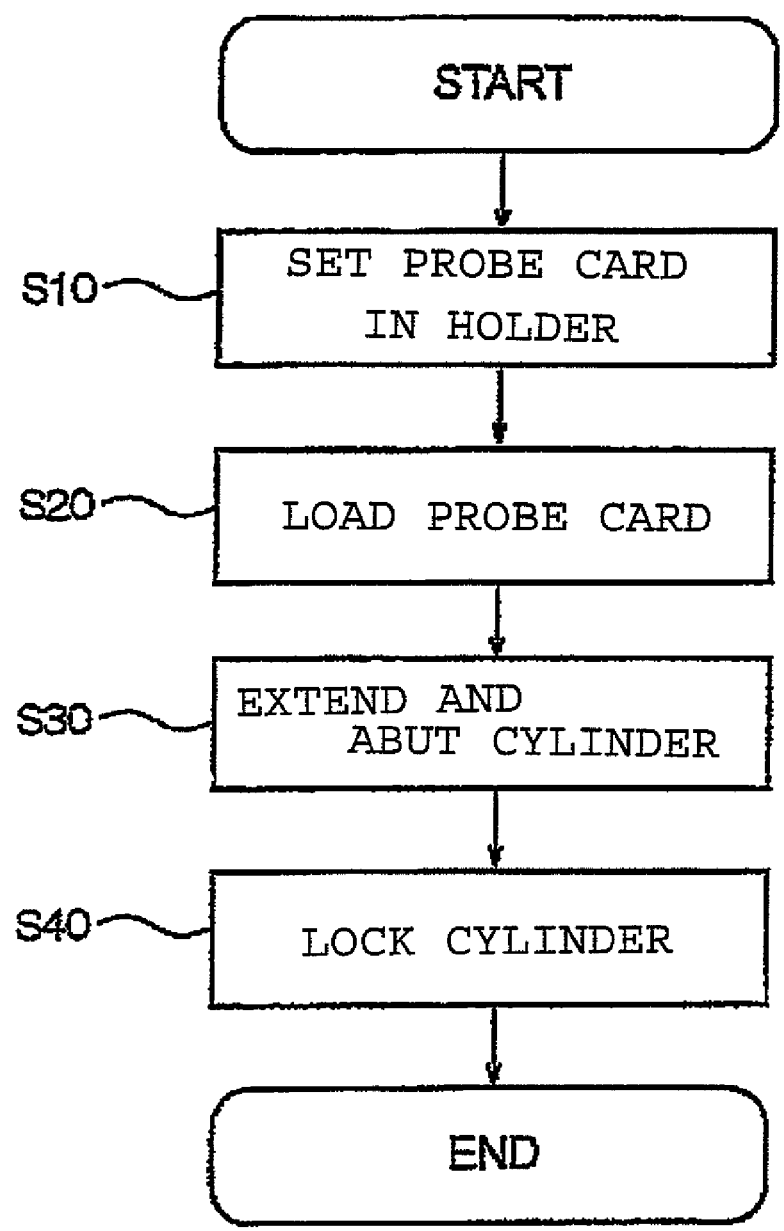
FIG. 6 is a flow chart showing a method of mounting the probe card according to the first embodiment of the present invention.
Figure 7A:
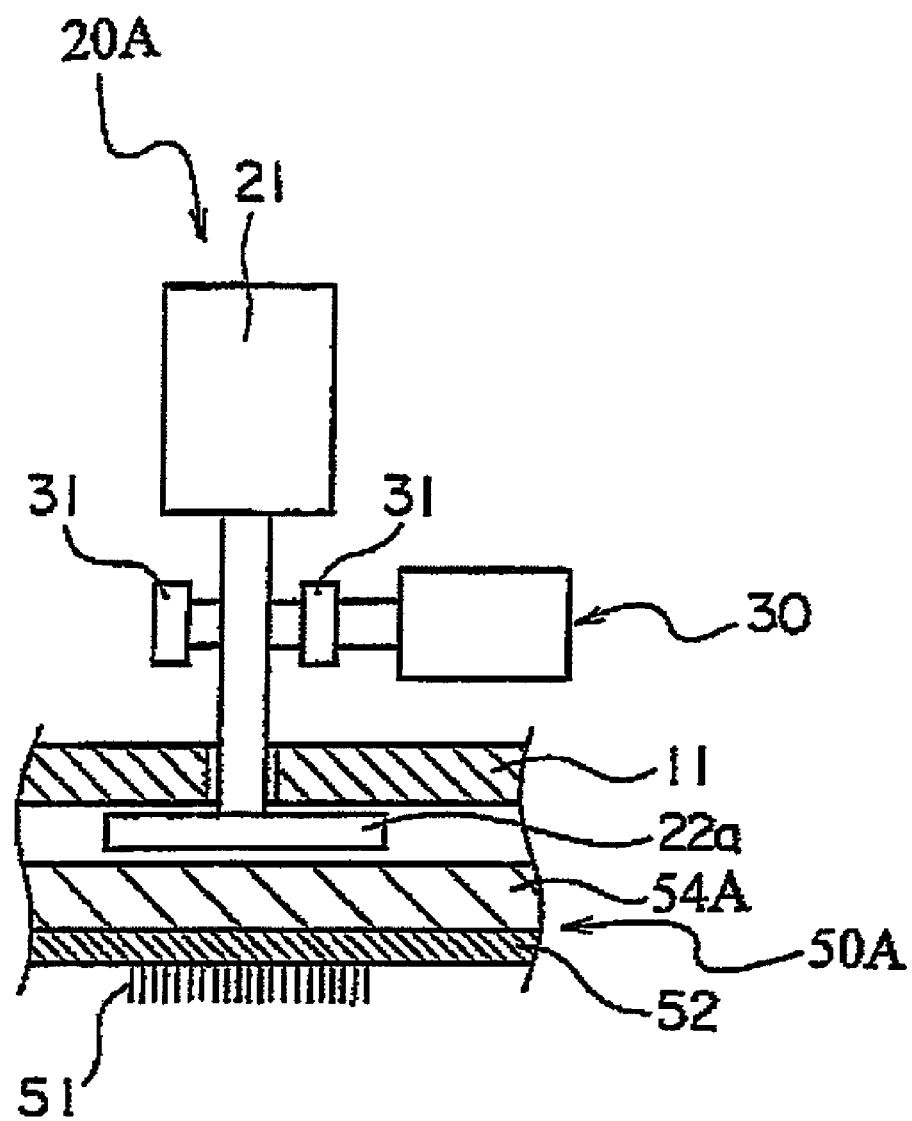
FIG. 7A is a schematic cross-sectional view of an abutting mechanism, a lock mechanism, and the probe card for explaining a method of mounting a probe card according to the first embodiment of the present invention and shows the state before the extension of the abutting mechanism.
Figure 7B:
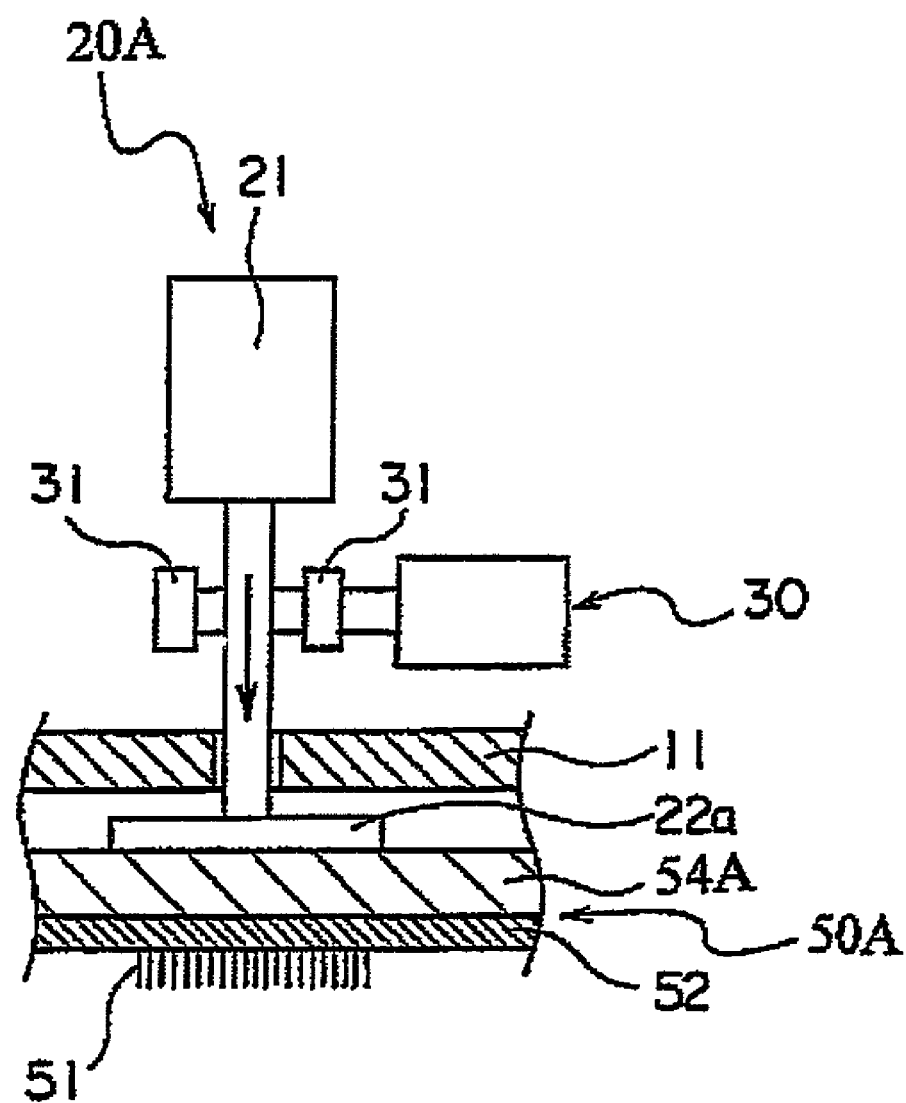
FIG. 7B is a schematic cross-sectional view of the abutting mechanism, the lock mechanism, and the probe card for explaining the method of mounting the probe card according to the first embodiment of the present invention and shows the state with the abutting mechanism extended.
Figure 7C:
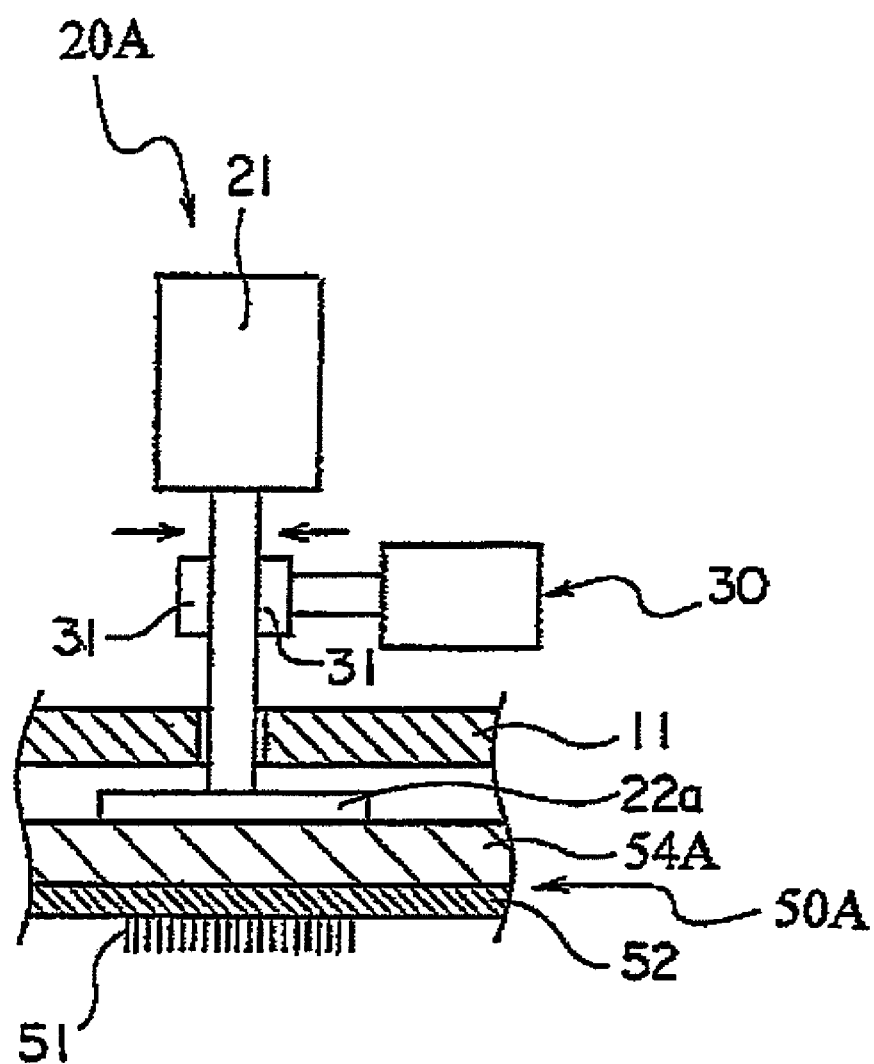
FIG. 7C is a schematic cross-sectional view of the abutting mechanism, the lock mechanism, and the probe card for explaining a method of mounting the probe card according to the first embodiment of the present invention and shows the state with the lock mechanism locking the abutting mechanism.

FIG. 6 is a flow chart showing a method of mounting a probe card according to a first embodiment of the present invention, and FIG. 7A to 7C are schematic cross-sectional views of the abutting mechanism, the lock mechanism, and the probe card for explaining a method of mounting a probe card according to the first embodiment of the present invention, where FIG. 7A shows the state before the extension of the abutting mechanism, FIG. 7B shows the state with the abutting mechanism extended, and FIG. 7C shows the state with the lock mechanism locking the abutting mechanism.

For example, when changing the probe card 50A along with a change in the type of the wafer W under test, as shown in FIG. 6, first the probe card 50A is held by the holder 60 so that the probe needles 51 face the center opening 61 and then the connectors 53 and 12 of the probe card 50A and HiFix interface 11 are connected to set the probe card 50A in the holder 60 (step S10). At this time, in the present embodiment, at the later step S40, the lock mechanism 30 fixes the probe card 50A at the holder 60, so there is no need to screw the probe card 50A into the holder 60. The probe card 50A may be just placed on the holder 60.

Next, the probe card 50A is inserted into the opening 72 of the prober 70 and the probe card 50A is loaded (step S20).

Next, the control apparatus 45 sends a control signal to the air feed apparatus 40 so as to feed air to the air cylinder 21 of the abutting mechanism 20A. Based on this control signal, as shown in FIG. 7A and FIG. 7B, the air feed apparatus 40 feeds air to the air cylinder 21 whereby the rod 21a of the air cylinder 21 extends and the abutting member 22a abuts against the back surface of the probe card 50A (step S30).

The control apparatus 45 starts to count the time from the start of feed of air from the air feed apparatus 40 to the air cylinder 21. When a predetermined time of an extent whereby the extension of the rod 21a is sufficiently completed elapses (for example, about 2 seconds), it sends a control signal to the air feed apparatus 40 so as to feed air to the lock mechanism 30. Based on this control signal, the air feed apparatus 40 feeds air to the lock mechanism 30 whereby, as shown in FIG. 7C, the clamp 31 clamps the rod 21a of the air cylinder 21 and firmly fixes it in place (step S40).

The above steps S10 to S40 complete the work of mounting the probe card 50A. Once the work of mounting the probe card 50A is completed, the usual test is performed. That is, the wafer W under test transported by the prober 70 into the housing 71 is pushed against the probe needles 51 of the probe card 50A and test signals are input to the IC devices by the tester and output back through the test head 10A so as to test the IC devices formed on the wafer W.

In the present embodiment, the abutting member 22a stops in the state abutting against the back surface of the probe card 50A, so the pushing position of the abutting member 22a is automatically adjusted. In this state, the rod 21a is firmly fixed in place by the lock mechanism 30. Due to this, at the time of a test, even if the transport arm 73 of the prober 70 pushes the wafer W against the probe card 50A, the pushing force can be directly received from the abutting member 22a at the back surface of the probe card 50A, so bending of the probe card 50A can be accurately prevented and the flatness of the probe card 50A can be maintained. Therefore, the reliability of contact with a large number of probe needles 51 is improved. Further, stable contact can be secured even for probe needles with small effective strokes in the pushing direction in which the probe needles 51 can be pushed.

Note that in the present embodiment, the abutting member 22a need only contact the back surface of the probe card 50A, so the pressure of the air fed to the air cylinder 21 may be a pressure of an extent making the abutting member 22a move up and down. No unnecessarily large load is placed on the probe card 50A.

Further, in the present embodiment, since the pushing force at the time of testing is directly received from the abutting member 22a at the back surface of the probe card 50A, even if not raising the rigidity of the stiffener, the increase in the pushing force due to the increase in the number of simultaneous measurements can be handled. This is also advantageous in terms of cost and handling.

Further, in the present embodiment, even if the boards of the probe cards 50A changed with each type of wafer W under test differ in thickness, a common stiffener can be applied. Further, in the present embodiment, bending and deformation of the probe card 50A can be eliminated, so stable electrical contact of the probe needles 51 can be realized and the test quality can be improved.

Note that in the above-mentioned first embodiment, the example was shown of fixing the rod 21a of the air cylinder 21 by a lock mechanism in the state where the abutting member 22a abuts against the back surface of the probe card 50A, but another configuration may also be employed. For example, a threaded shaft may be provided for the shaft of a rotational drive apparatus driving rotationally at a low speed and that threaded shaft may be turned to make the abutting member 22a extend or retract. Further, a contact sensor may be provided for detecting the abutting member 22a abutting against the back surface of the probe card 50A. Further, the threaded shaft may be turned by the rotational drive apparatus until the abutting member 22a abuts against the back surface of the probe card 50A.

Second Embodiment

Figure 8:
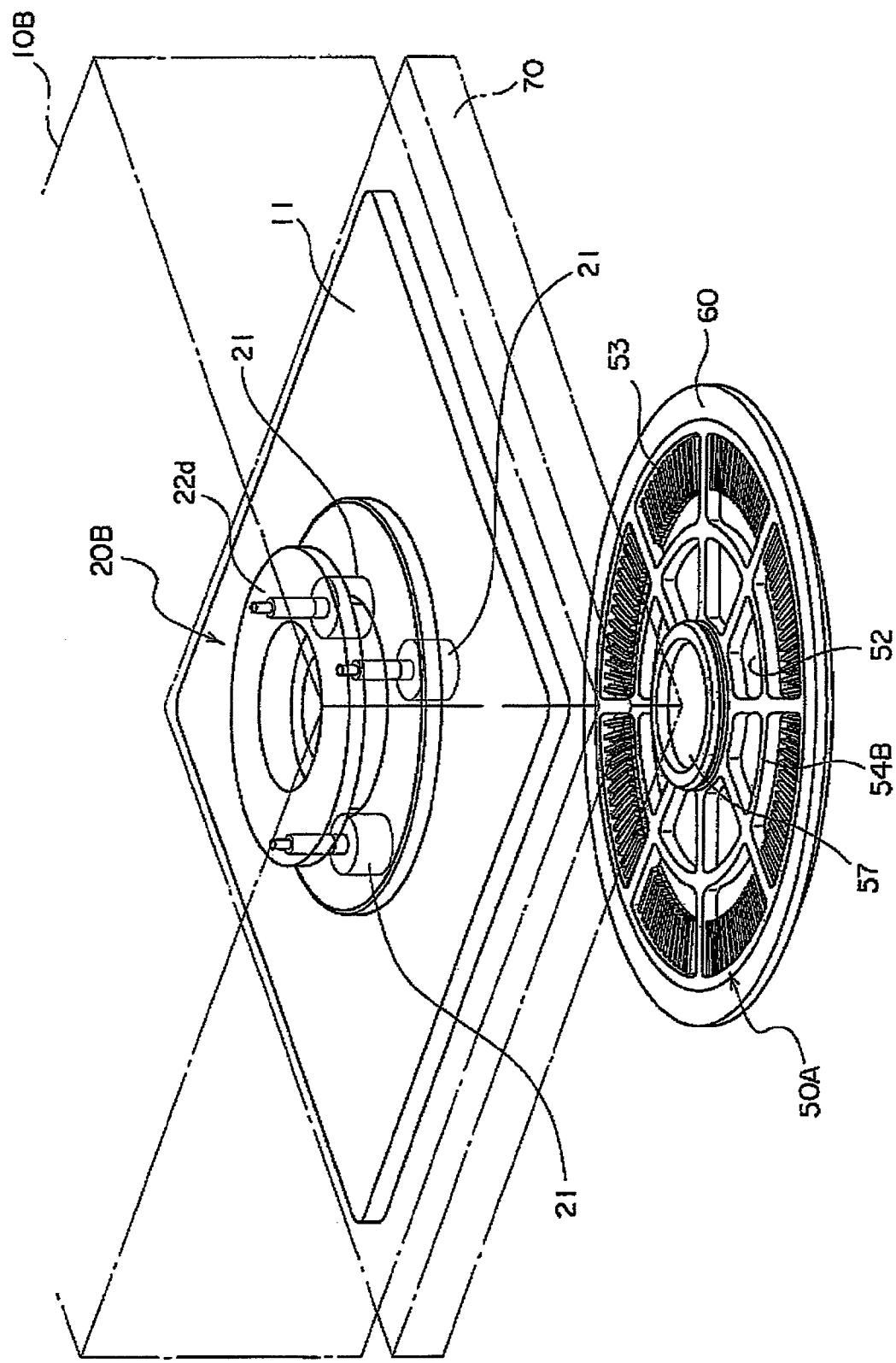
FIG. 8 is a partial perspective view showing the configuration of an electronic device test apparatus according to the second embodiment of the present invention.
Figure 9:
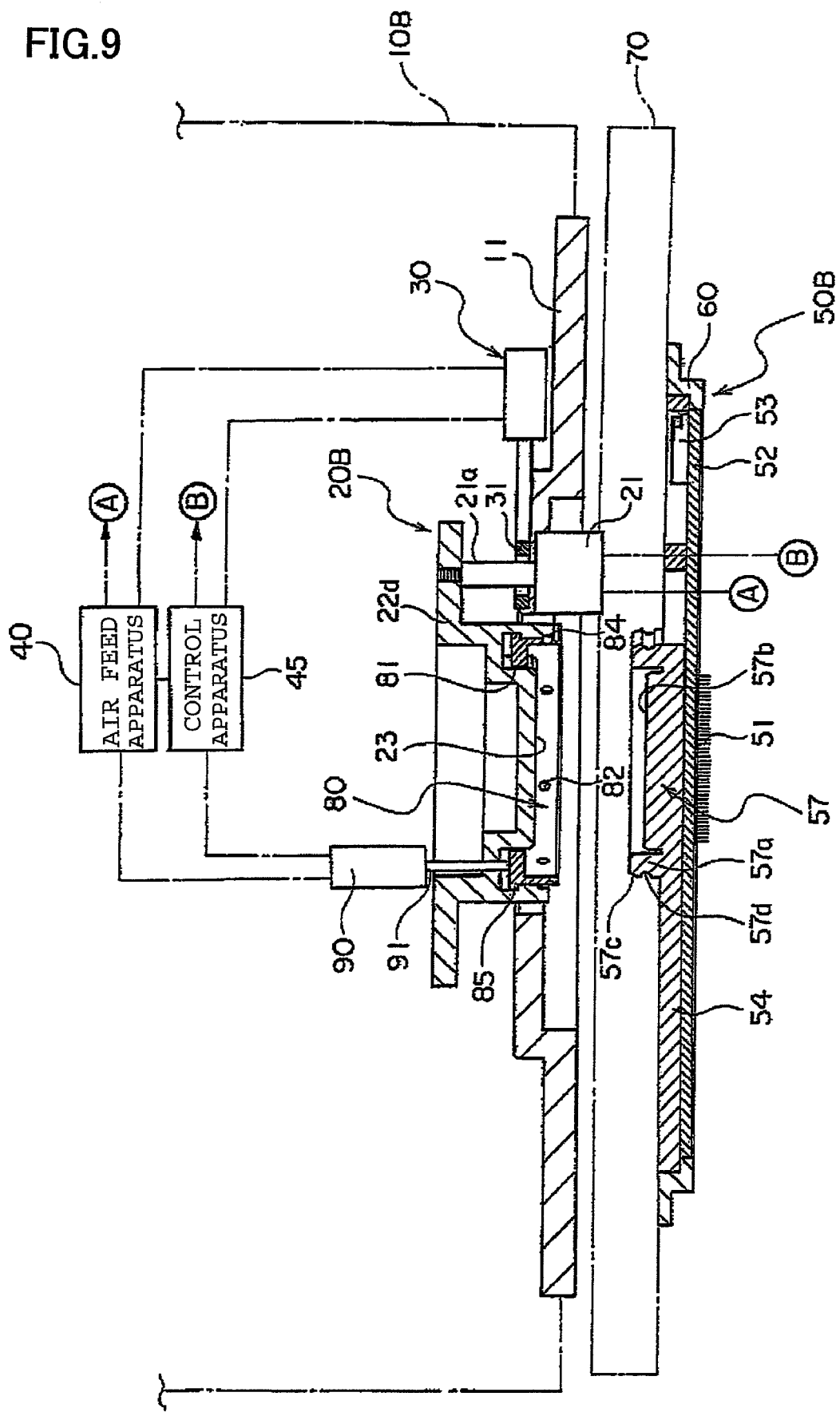
FIG. 9 is a partial cross-sectional view showing the configuration of the electronic device test apparatus according to the second embodiment of the present invention.

FIG. 8 and FIG. 9 are a partial perspective view and a partial cross-sectional view showing the configuration of an electronic device test apparatus according to the second embodiment of the present invention.

The probe card 50B in the present embodiment, as shown in FIG. 8 and FIG. 9, is similar to the probe card 50A in the first embodiment in the point of comprising probe needles 51, a printed circuit board 52, connectors 53, and a stiffener 54B, but differs from the probe card 50A in the first embodiment in the point of the stiffener 54B being provided with a clamp head 57 for engagement with slide bodies 80.

This clamp head 57, as shown in the drawings, is provided at the substantially center part of the back surface of the stiffener 54B and sticks out toward the test head 10B. The clamp head 57 has a recessed shape whose outside is surrounded by a ring-shaped wall 57a and whose inside is recessed. At the bottom of the recessed shape, there is formed an abutting face 57b with which the abutting member 22d abuts. Further, at the top part of the outside of the wall 57a, there is formed a taper face 57c for guiding steel balls 84 of the slide bodies 80. Further, the center part of the outside of the wall surface 57a is formed with a circumferential groove 57d for engagement with the steel balls 84 of the slide bodies 80 along the entire circumference in the circumferential direction.

The test head 10B in the present embodiment, like the test head 10A in the first embodiment, comprises an abutting mechanism 20B, lock mechanism 30, air feed apparatus 40, and control apparatus 45, but in the present embodiment, in addition, slide bodies 80 and air cylinders 90 are provided for holding the probe card 80. Note that FIG. 8 and FIG. 9 do not show the connectors 12 at the test head 10B side.

The abutting mechanism 20B of the test head 10B in the present embodiment, as shown in the drawings, comprises air cylinders 21 able to extend or retract rods 21a in the vertical direction by air fed from an air feed apparatus 40. The front ends of the rods 21a are provided with abutting members 22d abutting against the probe card 50B.

Each abutting member 22d has an abutting face 23 for abutting against the clamp head 57 of the probe card 50B at its bottom center part and has a downward opening ring-shaped recess 24 (see later explained FIG. 11B, FIG. 12B, FIG. 13B, and FIG. 14, same for the rib 25 and the circumferential groove 26) around the abutting face 23. Further, the abutting member 22d has a ring-shaped rib 25 projecting out below the abutting face 23 at the outer circumference of the recess 24. Below this rib 25, an inwardly opening circumferential groove 26 is formed across the entire circumference in the circumferential direction.

Each slide body 80 in the present embodiment, as shown in FIG. 9, is a ring-shaped member formed at its top with an opening 81 through which the abutting face 23 of an abutting member 22d can pass. The side surface of this slide body 80 is formed with through holes 82 having diameters enabling steel balls 84 to pass at substantially equal intervals along the circumferential direction. Note that to clarify the through holes 82, a steel ball 84 is shown inserted only in the through hole positioned at the leftmost side in FIG. 9. Steel balls 84 are not shown at the other through holes 82, but in actuality all of the through holes 82 have steel balls 84 inserted into them.

The top of each slide body 80 is formed with a projection 85 projecting out toward the outside in the diametrical direction. Further, this slide body 80 is inserted into the recess 24 of an abutting member 22d. The projection 85 engages with the step part of the recess 24 to restrict movement of the slide body 80 downward relative to the abutting member 22d. In the state with the projection 85 of the slide body 80 engaged with the step part of the recess 24, the through holes 82 of the slide body 80 face the circumferential groove 25 of the abutting member 22d.

Each slide body 80 is attached to the front end of the rod 91 of an air cylinder 90 and can move up and down relative to an abutting member 22d. Note that the slide body 80 in the present embodiment corresponds to one example of the holding means in the claims, while the air cylinder 90 in the present embodiment corresponds to one example of the moving means in the claims.

Below, a method of mounting a probe card in an electronic device test apparatus according to the second embodiment of the present invention will be explained.

Figure 10:
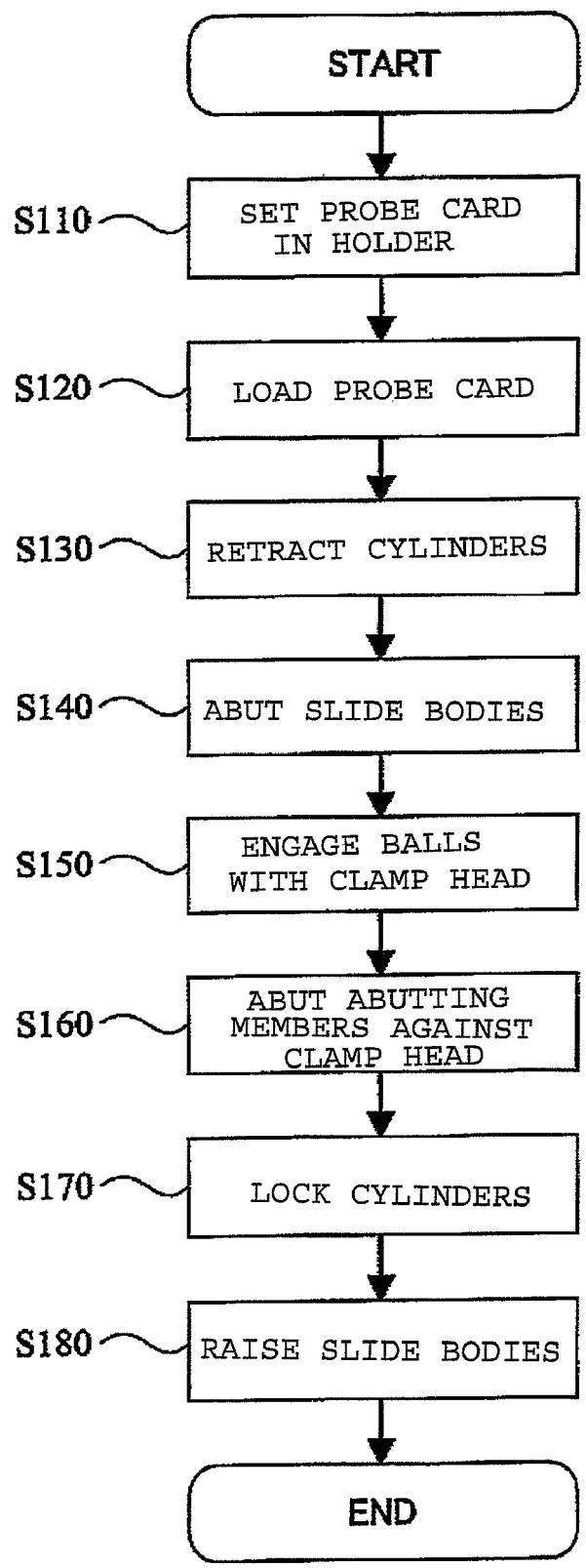
FIG. 10 is a flow chart showing a method of mounting the probe card according to the second embodiment of the present invention.

FIG. 10 is a flow chart showing a method of mounting a probe card according to the second embodiment of the present invention, while FIG. 11A to FIG. 14 are views for explaining a method of mounting a probe card according to the second embodiment of the present invention.

For example, when changing the probe card 50B along with a change in the type of the wafer W under test, as shown in FIG. 10, first the probe card 50B is held by the holder 60 so that the probe needles 51 face the center opening 61 and then the connectors 53 and 12 of the probe card 50B and HiFix interface 11 are connected to set the probe card 50B in the holder 60 (step S110). At this time, in the present embodiment, at the later step S170, the lock mechanism 30 fixes the probe card 50B at the holder 60, so there is no need to screw the probe card 50B into the holder 60. The probe card 50B may be just placed on the holder 60.

Next, the probe card 50B is inserted into the opening 72 of the prober 70 and the probe card 50B is loaded (step S120).

Figure 11A:
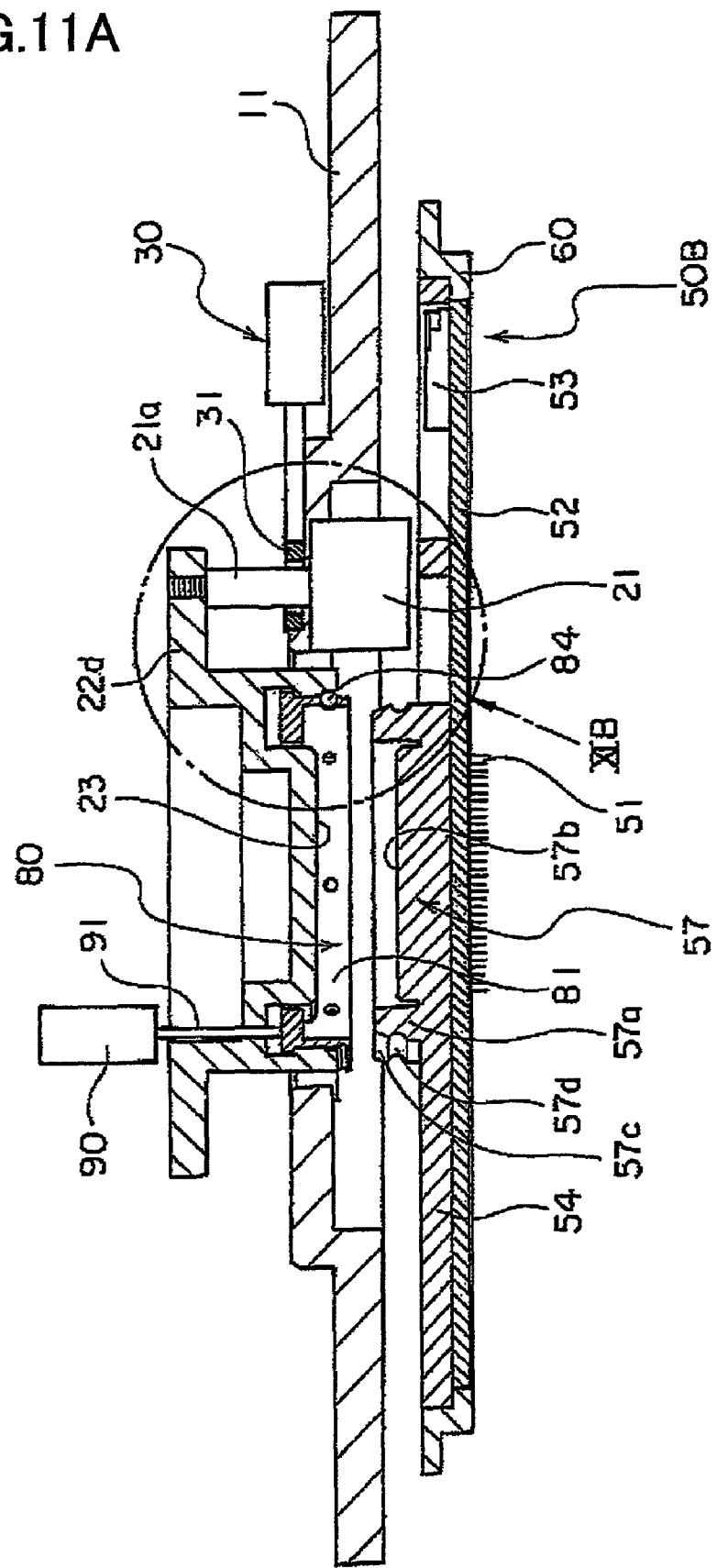
FIG. 11A is a partial cross-sectional view for explaining the method of mounting the probe card according to the second embodiment of the present invention and shows the state where the abutting member approaches the back surface of the probe card.
Figure 11B:
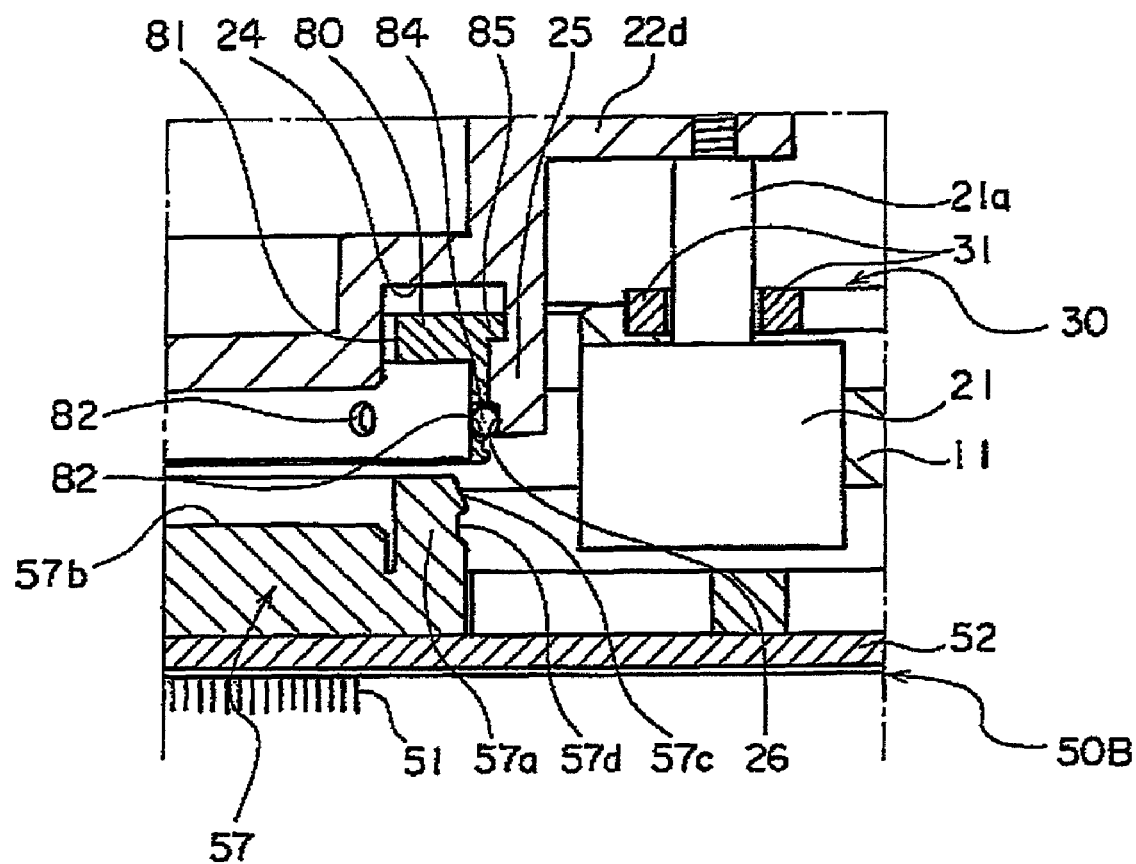
FIG. 11B is an enlarged view of the part XIB of FIG. 11A.

Next, the control apparatus 45 sends a control signal to the air feed apparatus 40 so as to feed air to the air cylinders 21 of the abutting mechanism 20B. Based on this control signal, as shown in FIG. 11A and FIG. 11B, the air feed apparatus 40 feeds air to the air cylinders 21 whereby the rods 21a of the air cylinders 21 retract (step S130).

When the air cylinders 21 lower the abutting members 22d, the steel balls 84 are pushed outward along the taper face 57c of the clamp head 57 and enter the circumferential grooves 26 of the abutting members 22d.

Figure 12A:
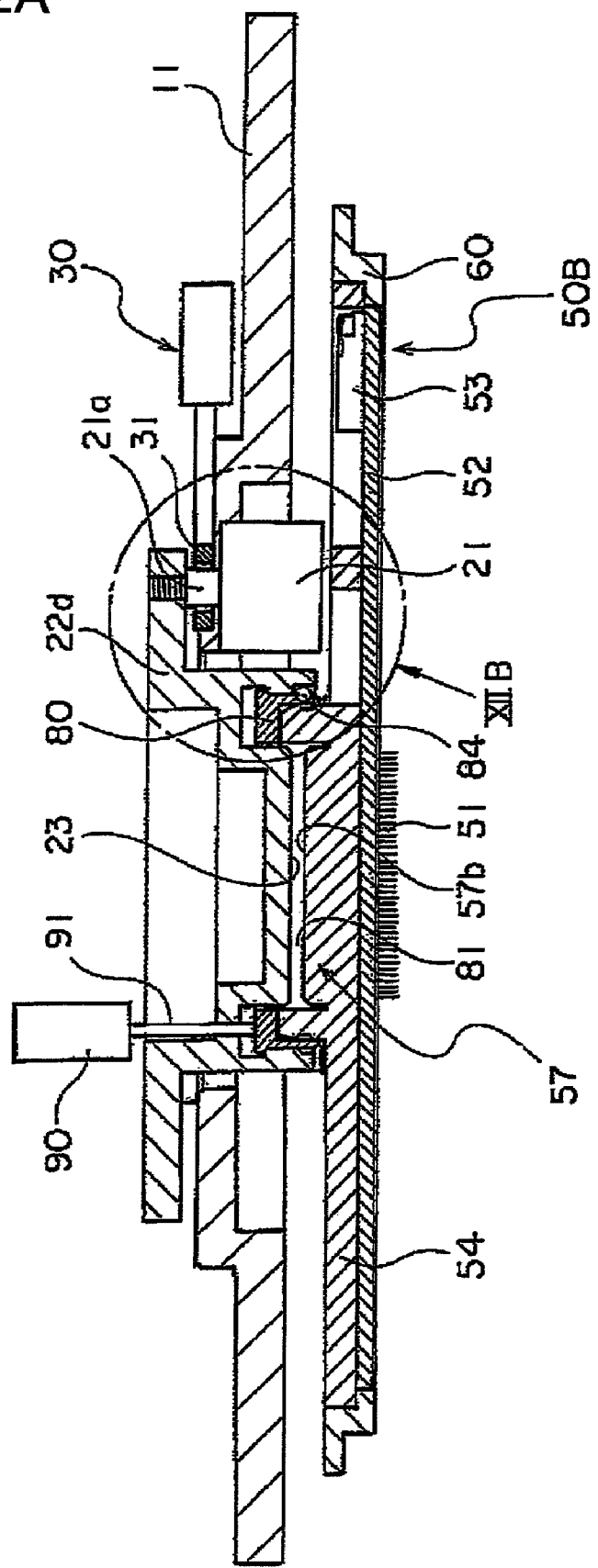
FIG. 12A is a partial cross-sectional view for explaining the method of mounting the probe card according to the second embodiment of the present invention and shows the state where a slide body abuts against the back surface of the probe card.
Figure 12B:
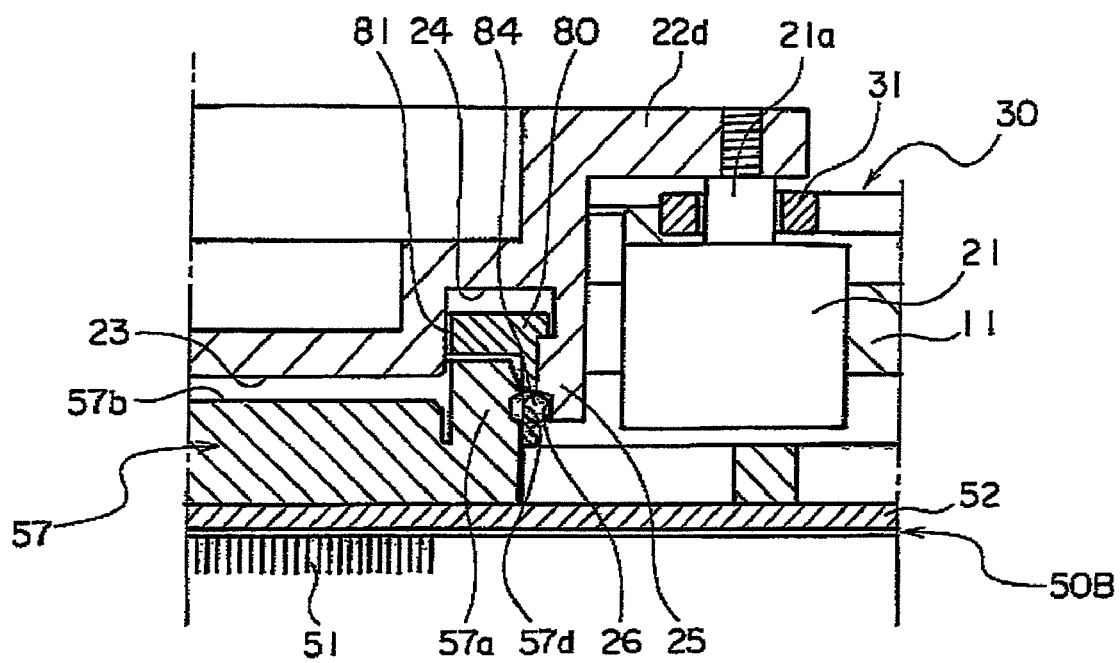
FIG. 12B is an enlarged view of the part XIIB of FIG. 12A.

When the air cylinders 21 further lower the abutting members 22d, as shown in FIG. 12A and FIG. 12B, the front ends of the slide bodies 80 sticking out further downward compared with the abutting members 22d abut against the stiffener 54B of the probe card 50B (step S140).

Figure 13A:
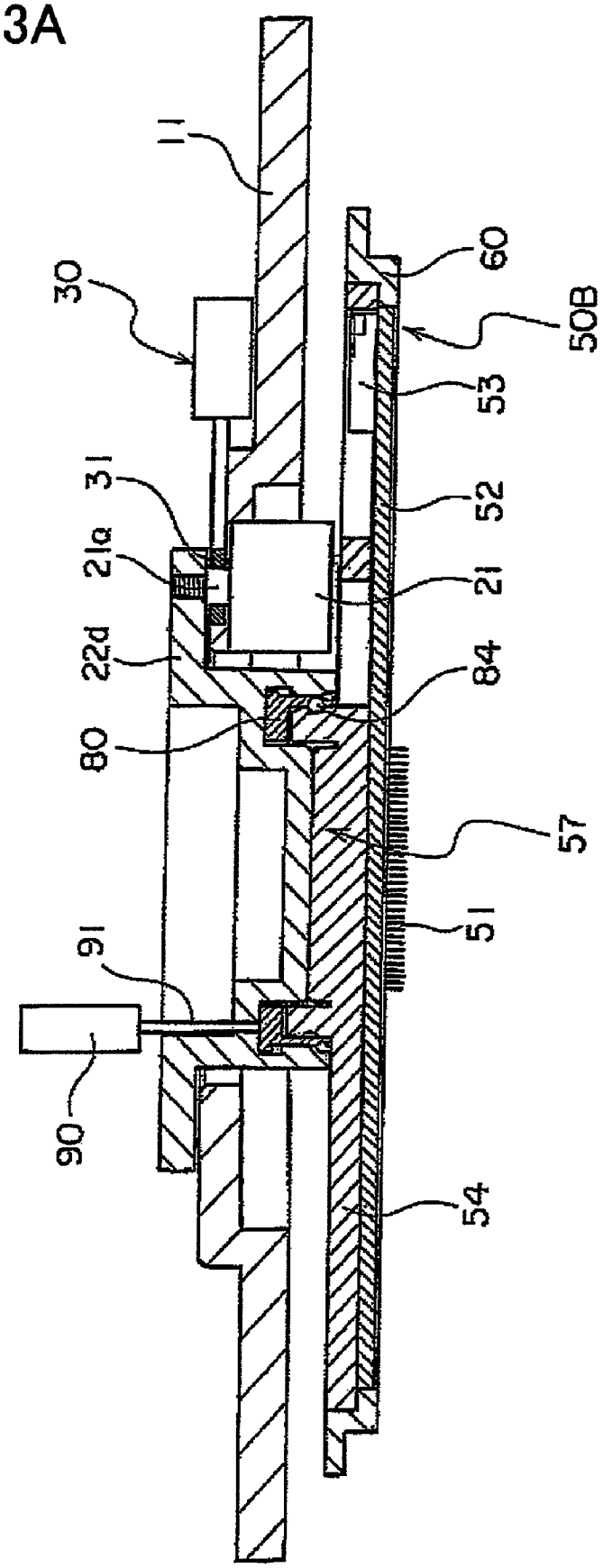
FIG. 13A is a partial cross-sectional view for explaining the method of mounting the probe card according to the second embodiment of the present invention and shows the state where the air cylinder is locked.
Figure 13B:
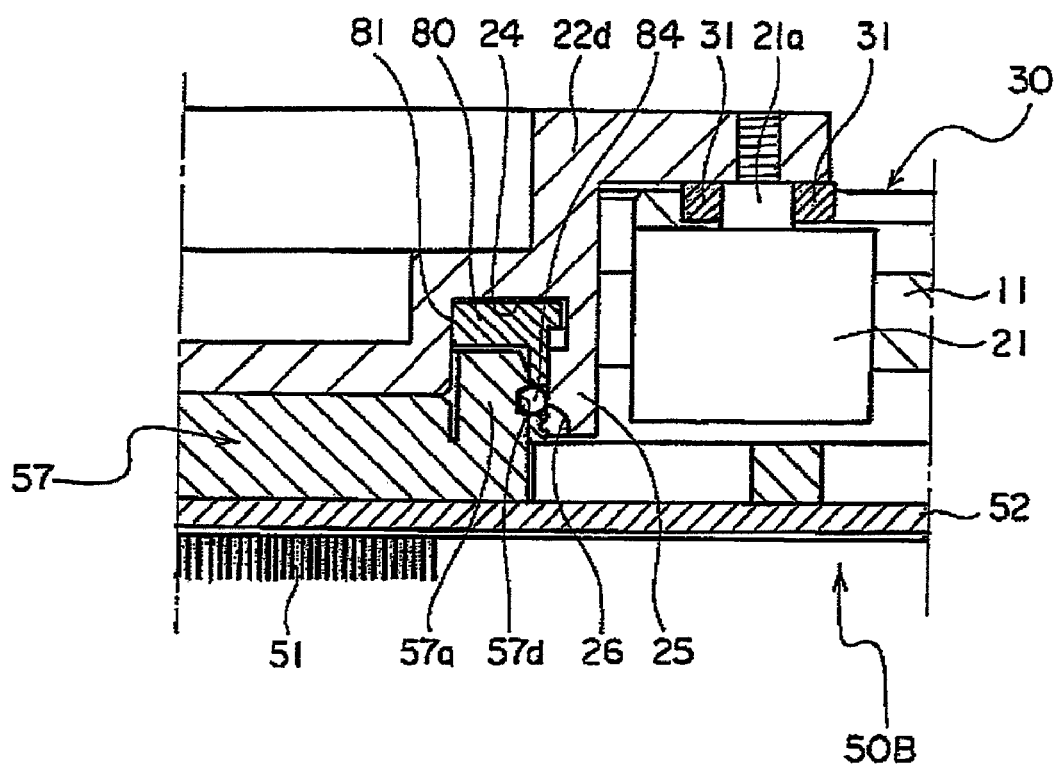
FIG. 13B is an enlarged view of the part XIIIB of FIG. 13A.

When the air cylinders 21 further lower the abutting members 22d, as shown in FIG. 13A and FIG. 13B, the abutting members 22d move downward relative to the slide bodies 80 abutting against and stopped at the stiffener 54B. Due to this operation, the steel balls 84 are pushed out from the insides of the circumferential grooves 26 of the abutting members 22d and enter the circumferential groove 57d of the clamp head 57 (step S150). Due to this, the probe card 50B is held by the slide bodies.

The control apparatus 45 starts to count the time from the start of feed of air from the air feed apparatus 40 to the air cylinders 21. When a predetermined time of an extent whereby the retraction of the rods 21a is sufficiently completed elapses, it sends a control signal to the air feed apparatus 40 so as to feed air to the lock mechanism 30. Based on this control signal, the air feed apparatus 40 feeds air to the lock mechanism 30 whereby, as shown in FIG. 13A and FIG. 13B, the clamps 31 clamp the rods 21a of the air cylinders 21 and firmly fix them in place (step S170).

Figure 14:
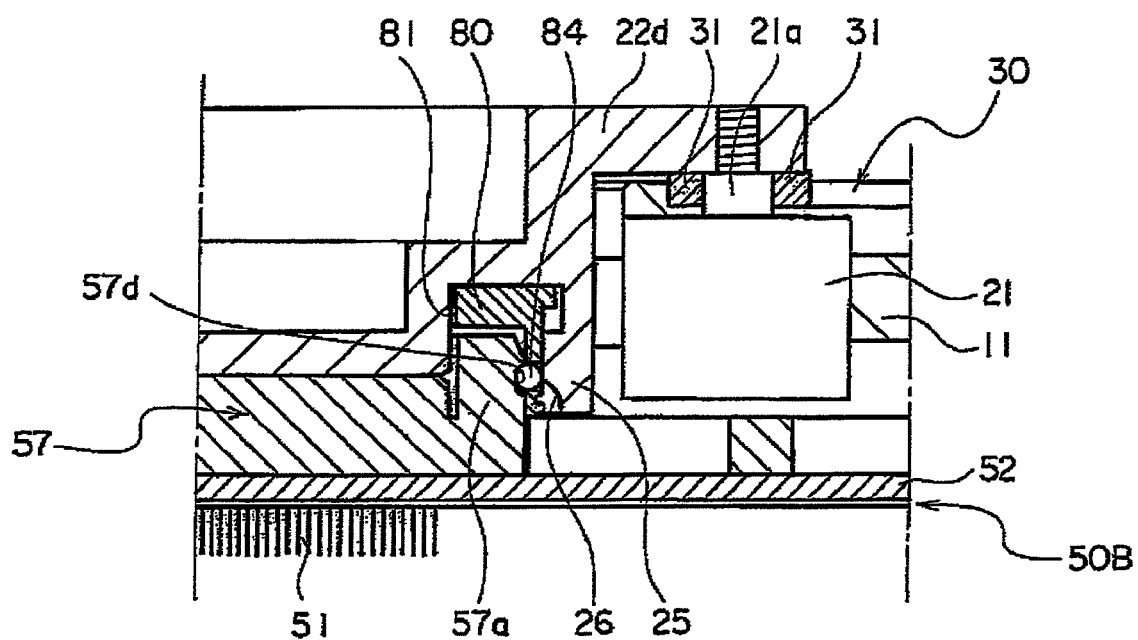
FIG. 14 is an enlarged cross-sectional view for explaining the method of mounting the probe card according to the second embodiment of the present invention and shows the state where the slide body is raised.
Figure 15:
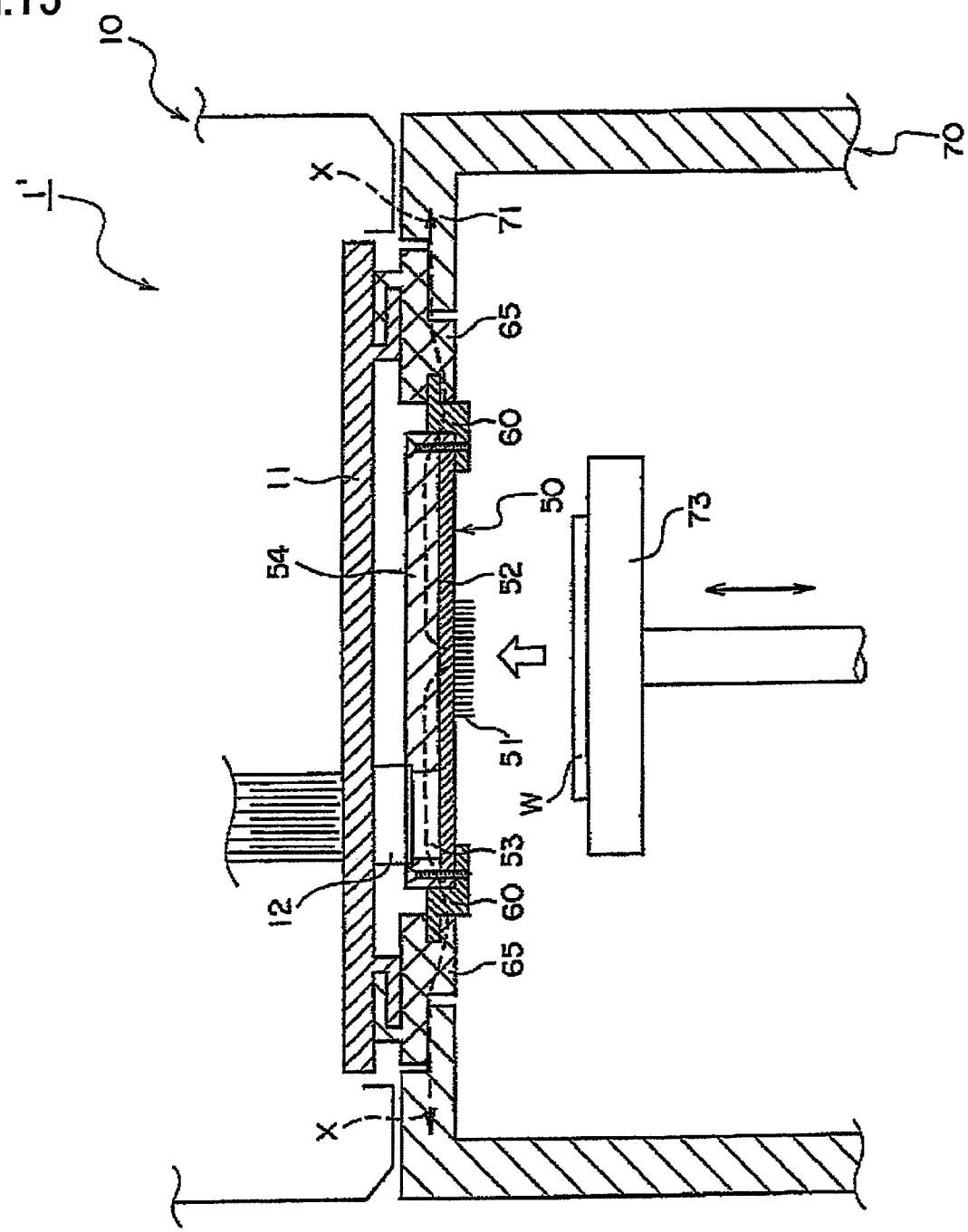
FIG. 15 is a schematic cross-sectional view showing the configuration of a conventional electronic device test apparatus.

Next, the control apparatus 45 sends a control signal to the air feed apparatus 40 so as to feed air to the air cylinders 90. Based on this control signal, the air feed apparatus 40 feeds air to the air cylinders 90 and the rods 91 of the air cylinders 90 are retracted (step S180). Due to this, as shown in FIG. 14, the contact positions of the steel balls 84 and the circumferential groove 57d moves from the substantial center of the circumferential groove 57d (see FIG. 13B) to the top of the circumferential groove 57d (see FIG. 14) and the slide bodies 80 are raised in the upward direction relative to the abutting members 22d, so the abutting faces 23 of the abutting members 22d and the abutting face 57b of the clamp head 57 of the probe card 50B come into close contact.

The above steps S110 to S180 complete the work of mounting the probe card 50B. Once the work of mounting the probe card 50B is completed, the usual test is performed. That is, the wafer W under test transported by the prober 70 into the housing 71 is pushed against the probe needles 51 of the probe card 50B and test signals are input to the IC devices by the tester and output from them through the test head 10B so as to test the IC devices formed on the wafer W.

In the present embodiment, the rods 21a are fixed by the lock mechanism 30 in the state with the abutting members 22d abutting against the back surface of the probe card 50B, so it is possible to prevent the probe card 50B from bending at the time of testing.

Further, in the present embodiment, the pushing force at the time of testing is directly received from the abutting members 22d at the back surface of the probe card 50B, so even without raising the rigidity of the stiffener, it is possible to deal with an increase in the pushing force due to an increase in the number of simultaneous measurements. This is also good in the point of cost and handling.

Note that in the present embodiment, the slide bodies 80 can hold the probe card 50B, so the holder 60 may be eliminated. In this case, it is possible to allow heat expansion of the probe card 50B in the diametrical direction and eliminate deformation in the height direction and possible to secure further stabler contact.

Further, at step S180 of FIG. 10, the slide bodies 80 are raised relative to the abutting members 22d to make the abutting faces 23 of the abutting members 22d and the abutting face 57b of the probe card 50B come into close contact, so looseness between the abutting members 22d and the probe card 50B is eliminated and a stable state of close contact can be maintained.

Note that the above explained embodiments were described for facilitating the understanding of the present invention and were not described to limit the present invention. Therefore, the elements disclosed in the above embodiments include all design modifications and equivalents falling under the technical scope of the present invention.

For example, in the above-mentioned embodiments, the explanation was given of application to an electronic device test apparatus of a type testing ICs formed on a wafer W using a prober 70, but the present invention is not particularly limited to this and may also be applied to an electronic device test apparatus of a type testing packaged ICs using a handler.

The invention claimed is:

1. A test head for testing an electronic device under test for electrical characteristics, the test head to which a performance board electrically connected to the electronic device under test is electrically connected,
the test head comprising:
an abutting device configured to move an abutting member toward a back surface of the performance board so that the abutting member abuts against the back surface of the performance board; and
a fixing device configured to fix and release the abutting member in a state where the abutting member abuts against the back surface of the performance board, wherein
the test head further comprises a holding device configured to hold the performance board at a center part of the performance board and/or a periphery of the center part.

2. The test head as set forth in claim 1, further comprising a moving device configured to move the holding device with respect to the abutting member so as to pull the performance board toward the abutting member.

3. An electronic device test apparatus comprising:
the test head as set forth in claim 1;
a performance board electrically connected the electronic device under test and the test head; and
a pushing device configured to push the electronic device under test against the performance board so as to electrically connect the electronic device under test and the performance board.

4. The electronic device test apparatus as set forth in claim 3, wherein
the electronic device under test is a semiconductor device formed on a wafer,
the performance board is a probe card having contactors electrically contacting electrodes of the semiconductor device,
the pushing device is a prober able to hold and move the wafer, and
the abutting member abuts against a back surface of a part of the probe card where the contactors are provided and/or of a periphery of the part where the contactors are provided.

5. A method of mounting a performance board in an electronic device test apparatus comprising: a test head for testing an electronic device under test for electrical characteristics; a performance board electrically connected to the electronic device under test and the test head; and a pushing device configured to push the electronic device under test against the performance board so as to electrically connect the electronic device under test to the performance board, the method of mounting a performance board comprising:
(a) electrically connecting the performance board and the test apparatus body through connectors;
(b) moving an abutting member toward a back surface of the performance board so that the abutting member abuts against the back surface of the performance board; and
(c) fixing the abutting member in a state where the abutting member abuts against the back surface of the performance board, wherein the method of mounting a performance board further comprises (d) holding the performance board at a center part of the performance board and/or a periphery of the center part.

6. The method of mounting a performance board as set forth in claim 5, further comprising (e) pulling the performance board toward the abutting device so that the abutting member closely contacts the back surface of the performance board.

7. The method of mounting a performance board as set forth in claim 5, wherein
the electronic device under test is a semiconductor device formed on a wafer,
the performance board is a probe card having contactors electrically contacting electrodes of the semiconductor device,
the pushing device is a prober able to hold and move the wafer, and
in (b), the abutting member abuts against a back surface of a part of the probe card where the contactors are provided and/or of a periphery of the part where the contactors are provided.

* * * * *